United States Patent
Lee et al.

(10) Patent No.: US 7,265,603 B2
(45) Date of Patent: Sep. 4, 2007

(54) MOSFET GATE DRIVER WITH A NEGATIVE GATE BIAS VOLTAGE

(75) Inventors: Chik Yam Lee, Courtaboeuf Cedex (FR); Vincent Thiery, LaRoque D'Antheron (FR)

(73) Assignee: International Rectifier Corporation, El Segundo, CA (US)

( * ) Notice: Subject to any disclaimer, the term of this patent is extended or adjusted under 35 U.S.C. 154(b) by 6 days.

(21) Appl. No.: 10/746,681

(22) Filed: Dec. 23, 2003

(65) Prior Publication Data

US 2004/0227193 A1    Nov. 18, 2004

Related U.S. Application Data

(60) Provisional application No. 60/469,923, filed on May 12, 2003.

(51) Int. Cl.
*H03K 17/687* (2006.01)
(52) U.S. Cl. .............. 327/427; 327/434; 327/423; 327/494; 327/508
(58) Field of Classification Search .......... 327/108, 327/109, 112, 427, 434, 423, 494, 508; 326/81, 326/82, 83, 85, 86, 87
See application file for complete search history.

(56) References Cited

U.S. PATENT DOCUMENTS

| | | | | |
|---|---|---|---|---|
| 5,099,148 A | * | 3/1992 | McClure et al. | 326/86 |
| 5,481,178 A | * | 1/1996 | Wilcox et al. | 323/287 |
| 5,568,044 A | * | 10/1996 | Bittner | 323/272 |
| 5,627,460 A | * | 5/1997 | Bazinet et al. | 323/288 |
| 5,943,227 A | * | 8/1999 | Bryson et al. | 363/95 |
| 6,081,075 A | * | 6/2000 | Littlefield | 315/209 R |
| 6,396,250 B1 | * | 5/2002 | Bridge | 323/283 |
| 6,696,861 B1 | * | 2/2004 | Baldwin et al. | 326/83 |
| 6,731,486 B2 | * | 5/2004 | Holt et al. | 361/91.1 |

FOREIGN PATENT DOCUMENTS

JP    04-070118    3/1992
JP    05-268038    10/1993

* cited by examiner

*Primary Examiner*—Tuan T. Lam
*Assistant Examiner*—Hiep Nguyen
(74) *Attorney, Agent, or Firm*—Ostrolenk, Faber, Gerb & Soffen, LLP

(57) ABSTRACT

A circuit for preventing shoot-through in a high side switching transistor coupled in series with a low side switching transistor across a supply voltage, the circuit comprising a voltage reference circuit having an output providing a reference voltage which is negative with respect to the supply voltage provided to the high side switching transistor, the reference voltage being applied to the control electrode of the high side switching transistor when the high side switching transistor is off and the source of the high side switching transistor exceeds the reference voltage and the low side switching transistor is on.

12 Claims, 2 Drawing Sheets

MOSFET GATE DRIVER WITH A NEGATIVE GATE BIAS VOLTAGE

CROSS REFERENCE TO RELATED APPLICATION

Figure 1:
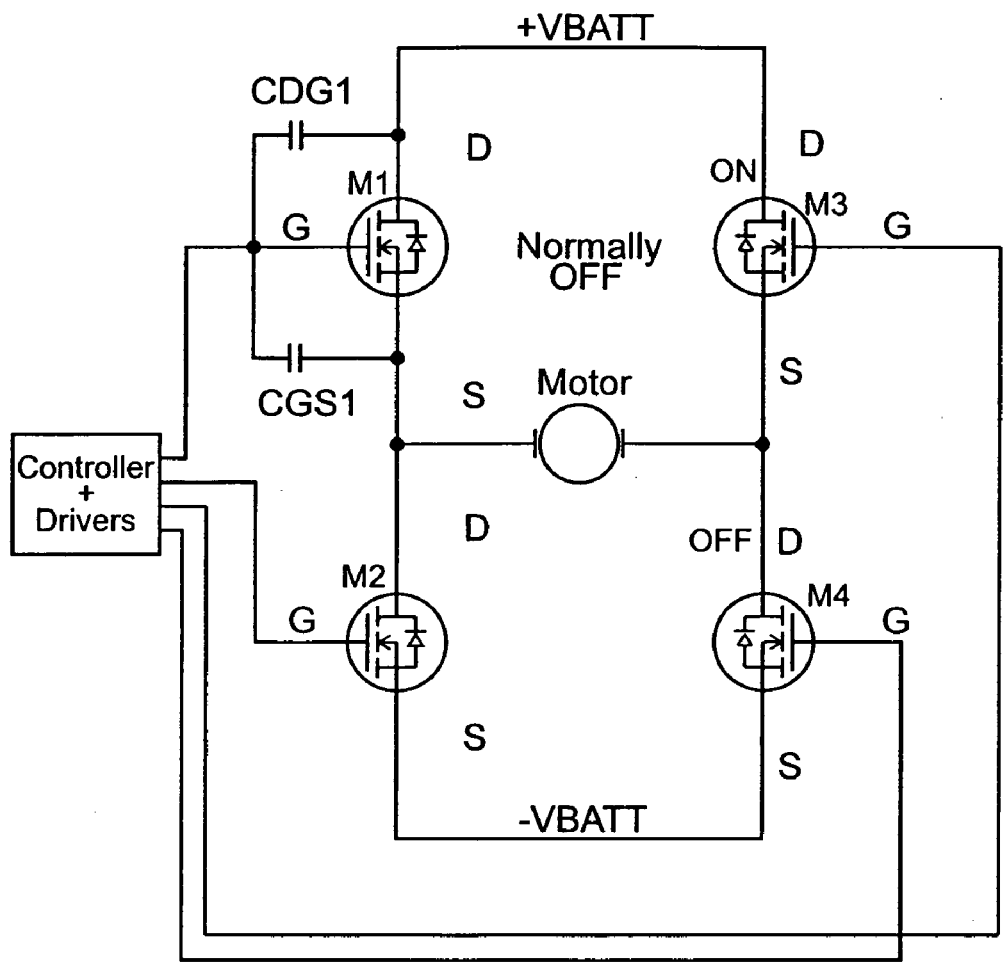

This application claims the benefit and priority of U.S. provisional patent application entitled "MOSFET GATE DRIVER WITH A NEGATIVE GATE VOLTAGE" (IR-1849 (2-2284)), filed May 12, 2003, Ser. No. 60/469,923, the entire disclosure of which is hereby incorporated by reference herein.

BACKGROUND OF THE INVENTION

The present invention relates to power MOSFET gate driver circuits. In particular, the present invention relates to the prevention of shoot-through currents in MOSFET switching circuits, for example, in half-bridge and H-bridge switching circuits for switching a load, for example, an electric motor. In a typical MOSFET switching circuit, for example a half-bridge circuit, there are two MOSFETs arranged in series, one of which is the high side switch and the other the low side switch. The high side switch is connected to a first higher voltage source and the low side switch may be connected to a second lower voltage source or ground. The two switches are operated alternately so that neither of the two switches is on at the same time. Often a dead time is arranged between the on times of the two switches to ensure that neither is on at the same time. A problem arises in that due to stray capacitances, the high side driver may inadvertently be turned on at the same time that the low side driver is on, thus creating a short circuit. When the high side switch is turned off, conventionally the gate and the source of the switch are connected by a low resistance path so that the gate and source will almost have the same voltage. If the difference between the gate and source is less than the threshold voltage VT of the FET, the FET will remain off. However, in some applications, for example H-bridge motor drivers, as shown for example in FIG. 1, when the source of the high side FET M1 is switched very quickly from the power supply voltage to ground by the switching action of low side switch M2, an electric charge may be injected into the gate of the high side switch M1 through the stray capacitances CDG1 and CGS1, the drain-gate and gate-source capacitances, particularly due to currents from inductive loads such as motors. This will increase the gate-source voltage of the high side switch M1 and if this voltage is higher than the threshold voltage VT of the high side switch M1, the high side switch M1 will turn on, causing a shoot-through short circuit between the power supply and ground and damaging the circuit, in particular, irreversibly damaging the FETs.

In the past, one solution to this problem has been to place a very low resistance path between the gate and the source during turn off, as mentioned above. However, this solution causes unnecessary current drains and thus wastes power and further may inhibit switching operation.

SUMMARY OF THE INVENTION

According to the invention, a new solution to the shoot-through problem has been developed. When the high-side switch is off, instead of connecting the gate and source together through a low impedance path as in the prior art solution, the gate of the high side switch is connected to a voltage which is lower than that of the source of the high side switch, whenever the source and drain voltages are nearly equal. At other times, the gate voltage will be allowed to follow the source voltage. This negative gate voltage will also make the circuit more robust to fast changing control voltage changes because the injected charge due to the stray capacitances will increase the gate voltage from the negative bias voltage plus the FET threshold voltage in order to turn the FET on. Accordingly, the invention has the added advantage that in addition to preventing the shoot-through problem, it also increases reliability of the switching operation of the transistor switches.

Other features and advantages of the present invention will become apparent from the following description of the invention which refers to the accompanying drawings.

BRIEF DESCRIPTION OF THE DRAWING(S)

Figure 2:
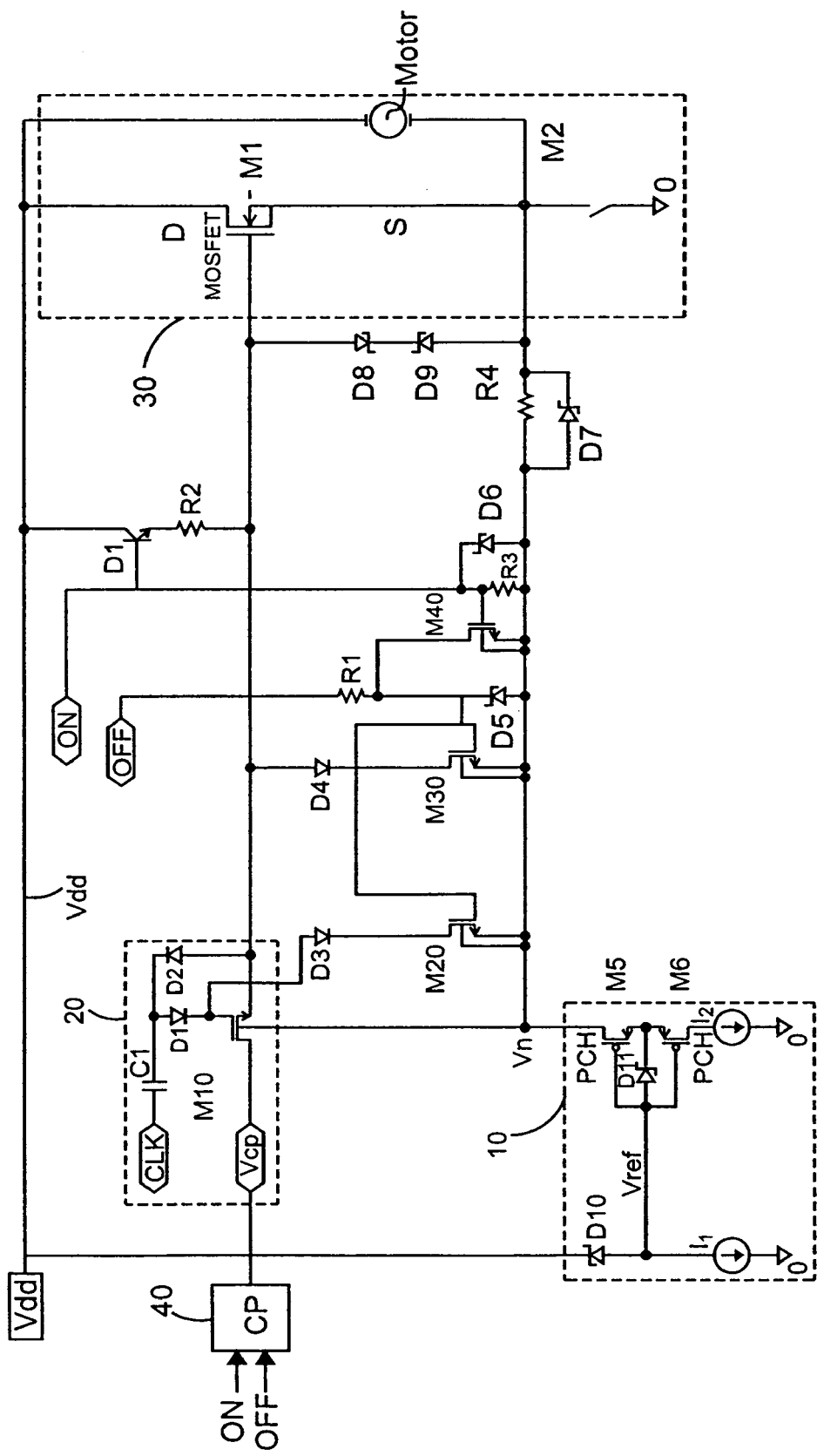

The invention will now be described in greater detail in the following detailed description with reference to the drawings in which:

FIG. 1 shows a typical H-bridge circuit for illustrating the prior art shoot-through problem; and FIG. 2 shows the circuit according to the present invention applied to a MOSFET switch for providing a solution to the shoot-through problem.

DETAILED DESCRIPTION OF PREFERRED EMBODIMENTS OF THE INVENTION

With reference to FIG. 2, the high side switch is indicated with reference numeral M1. The low side switch M2 is shown schematically. The motor load is indicated at M.

According to the invention, a biasing circuit is provided which includes a voltage reference circuit 10 for providing a bias that is coupled to the gate of the high side switch Ml by a transistor M30 and diode D4.

The voltage is generated in the reference voltage circuit 10 by a current source I1 and zener diode D1O. The reference voltage Vref is thus determined by the break down voltage VD1O of the zener diode D1O and is equal to Vdd-VD1O. The voltage Vref is thus lower than the power supply voltage Vdd to which the drain of MOSFET M1 is connected. It is thus negative in comparison to the drain voltage Vdd. The voltage Vref is applied to node Vn by a p channel transistor M5. Transistor M5 is coupled in series with a p channel transistor M6 and a second current source I2. Accordingly, Vn equals Vref plus the threshold voltage Vt of transistor M5. D11 and M6 are connected with transistor M5 and the gate of transistor M6 is coupled to the gate of transistor M5, so as to protect M5 against large reverse currents when Vn is lower than ground. This may occur when the source of M1 goes below ground.

Node Vn is coupled to the source of transistor M1 by resistor R4 and diode D7. When the source of transistor M1 is higher than node Vn equal to Vref plus Vt (M5), node Vn is tied to Vref plus Vt because the diode D7 is back biased. This bias voltage is applied to the gate of M1 by transistor M30 and diode D4. When the source of M1 is lower than Vn equal to Vref plus Vt, then Vn will follow the source voltage because diode D7 is forward biased.

The node Vn is coupled to the gate of M1 via transistor M30 and diode D4. Accordingly, when diode D7 is back biased, as it will be if the source voltage rises, the gate voltage will be reduced approximately to the level of Vn equal to Vref plus Vt (M5), thus negatively biasing the gate of M1 and keeping it off. When the source of transistor M1 is below Vn, node Vn will follow the source thus ensuring that the gate of transistor M1 is also low, ensuring that M1 is off while transistor M2 is on. Should the source of M1 suddenly rise due to switching action of M2, shoot-through of M1 is prevented because the gate voltage of M1 will be biased negatively by circuit 10.

The signals ON and OFF turn on and off the driver to the MOSFET M1. They are complementary signals so that when ON is high, OFF is low and vice versa. When the input ON is enabled, transistor Q1 will be turned on and transistors M40 and M30 will be turned OFF. At the same time, the signal input ON will turn on a charge pump 40. The charge pump 40 will generate a voltage VCP which is higher than the drain voltage of MOSFET M1. Furthermore, a clock signal CLK is provided to the circuit 20, which also comprises a charge pump. The clock signal generates a voltage by virtue of the charge pump circuit formed of capacitor C1 and diodes D1 and D2 thereby to turn transistor M10 on. When transistor M10 is turned on, VCP from the charge pump 40 will be applied to the gate of MOSFET M10 thereby turning it on. To turn transistor M10 off, the signal input OFF is enabled. When OFF is enabled, transistor M30 will be turned on, as will transistor M20. The charge pump 40 is also turned off. The gate voltage to transistor M10 will be discharged through diode D3 and transistor M20, thereby turning transistor M10 off and removing the gate voltage to switching transistor M1, turning it off. Since transistor M30 is on, the negative bias provided by circuit 10 to node Vn will be applied to the gate of MOSFET M1, preventing it from turning on due to shoot-through effects.

Although the present invention has been described in relation to particular embodiments thereof, many other variations and modifications and other uses will become apparent to those skilled in the art. Therefore, the present invention should be limited not by the specific disclosure herein, but only by the appended claims.

What is claimed is:

1. A circuit for preventing shoot-through in a high side switching transistor coupled in series with a low side switching transistor across a supply voltage, the circuit comprising:
   a voltage reference circuit having an output providing a reference voltage which is always negative with respect to the supply voltage provided to the high side switching transistor, and a switch circuit responsive to provide the reference voltage to the control electrode of the high side switching transistor when the high side switching transistor is off, the source of the high side switching transistor exceeds the reference voltage momentarily due to a stray capacitance of the high side switching transistor and the low side switching transistor is on.

2. The circuit of claim 1, wherein the voltage reference circuit comprises a first current source and a voltage reference device for generating a first voltage reference.

3. The circuit of claim 2, wherein the voltage reference circuit further comprises a switching transistor and a second current source in series with the switching transistor, a control electrode of the switching transistor being coupled to the first voltage reference, and wherein an output from the switching transistor comprises the reference voltage applied to the control electrode of the high side switching transistor.

4. The circuit of claim 1, wherein the output of the voltage reference circuit is coupled to the control electrode of the high side switching transistor by the switch circuit.

5. The circuit of claim 4, wherein the switch circuit further comprises a diode coupled in series with a further transistor.

6. The circuit of claim 1, wherein the output of the voltage reference circuit is coupled to a node between the high side and low side switching transistors by a diode so that when a voltage at the node between the high side and low side switching transistors becomes lower than the output of the voltage reference circuit, the output of the voltage reference circuit will follow the voltage level at the node between the high side and low side switching transistors.

7. The circuit of claim 1, wherein the high side and low side switching transistors comprise power MOSFETS.

8. The circuit of claim 1, further comprising a series connected transistor coupling a control signal to the control electrode of the high side switching transistor, the series connected transistor having a control electrode receiving a clock pulse when the high side switching transistor is to be turned on and further comprising a charge pump circuit coupled to the control electrode of said series connected transistor for turning said series connected transistor on to couple the control signal to the control electrode of the high side switching transistor.

9. The circuit of claim 6, wherein when said node between the high side and low side switching transistors is above the reference voltage, said diode prevents the output of the voltage reference circuit from following the voltage at said node.

10. A method for preventing shoot-through in a high side switching transistor coupled in series with a low side switching transistor across a supply voltage, the method comprising:
    providing a reference voltage which is always negative with respect to the supply voltage, and applying the reference voltage to the control electrode of the high side switching transistor using a switch circuit wherein the switch circuit is responsive to provide the reference voltage to the high side switching transistor when the high side switching transistor is off, the source of the high side switching transistor exceeds the reference voltage momentarily due to a stray capacitance of the high side switching transistor and the low side switching transistor is on.

11. The method of claim 10, wherein the reference voltage is coupled to a node between the high side and low side switching transistors so that when the node between the high side and low side switching transistors is lower than the reference voltage, the reference voltage will follow the voltage level at the node between said switching transistors.

12. The method of claim 11 further comprising, when said node between the high side and low side switching transistors is above the reference voltage, preventing the reference voltage from following the voltage at said node.

* * * * *